United States Patent
Henrich et al.

(10) Patent No.: US 7,837,796 B2
(45) Date of Patent: Nov. 23, 2010

(54) PROCESS CHAMBER, INLINE COATING INSTALLATION AND METHOD FOR TREATING A SUBSTRATE

(75) Inventors: Juergen Henrich, Limeshain (DE); Michael Schaefer, Altenstadt (DE); Edgar Haberkorn, Jossgrund (DE)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 11/680,361

(22) Filed: Feb. 28, 2007

(65) Prior Publication Data

US 2008/0184933 A1    Aug. 7, 2008

(30) Foreign Application Priority Data

Feb. 2, 2007    (EP) ................... 07101677

(51) Int. Cl.
C23C 16/00    (2006.01)
(52) U.S. Cl. .................. 118/715; 118/719; 118/728; 118/729
(58) Field of Classification Search ............ 118/715, 118/719, 728, 729
See application file for complete search history.

(56) References Cited

U.S. PATENT DOCUMENTS

| | | | | |
|---|---|---|---|---|
| 5,423,971 | A * | 6/1995 | Arnold et al. ......... | 204/298.11 |
| 6,079,358 | A | 6/2000 | Kim et al. | |
| 6,177,129 | B1 | 1/2001 | Wagner et al. | |
| 6,315,879 | B1 | 11/2001 | Washburn et al. | |
| 6,491,802 | B2 | 12/2002 | Ishikawa et al. | |
| 6,890,862 | B2 | 5/2005 | Wagner et al. | |
| 6,960,263 | B2 | 11/2005 | Tanaka et al. | |
| 2003/0155076 | A1 | 8/2003 | Murakami | |
| 2004/0107911 | A1 | 6/2004 | Hur | |
| 2005/0103271 | A1 * | 5/2005 | Watanabe et al. ........... | 118/719 |
| 2006/0108231 | A1 * | 5/2006 | Weichart ................... | 205/165 |
| 2006/0150910 | A1 * | 7/2006 | Han et al. .................. | 118/721 |

FOREIGN PATENT DOCUMENTS

DE    10134513 A1    7/2001

(Continued)

*Primary Examiner*—Michael Cleveland
*Assistant Examiner*—Keath T Chen
(74) *Attorney, Agent, or Firm*—Townsend and Townsend and Crew LLP

(57) ABSTRACT

A process chamber 1 for PECVD (Plasma Enhanced Chemical Vapor Deposition) coating of a substrate includes an electrode, which is integrated in a contact frame, which is firmly connected to the recipient. A movable carrier in the process chamber carries at least one substrate. The carrier is transported by means of a driven roller positioner into the process chamber or out of the process chamber along a transport route defined by the movement. As soon as the carrier inside the recipient has reached a certain position, the lower roller positioner is uncoupled from carrier by lowering by means of a lifting device. In this regard, the carrier detaches itself from the upper roller positioner. Then, the carrier is accepted by a transfer device (not shown) and brought from the transport position laterally into a treatment position in contact with the contact frame. In this way, reliable contact is produced between the electrode and a counter-electrode provided in carrier. At the same time, other carriers, in so far as the contact frame is removed laterally far enough from the transport route, during the coating of the carrier, can be moved past this.

19 Claims, 3 Drawing Sheets

FOREIGN PATENT DOCUMENTS

| | | |
|---|---|---|
| EP | 0 528 405 A2 | 2/1993 |
| EP | 0 930 642 A1 | 7/1999 |
| EP | 1032053 A3 | 6/2000 |
| EP | 1032023 A3 | 5/2004 |
| JP | 61 007631 A | 1/1986 |
| JP | 63028863 A2 | 2/1988 |
| JP | 2001118907 A2 | 4/2001 |
| JP | 2002203883 A2 | 7/2002 |
| JP | 2004332117 A2 | 11/2004 |
| KR | 200668439 A | 6/2006 |
| WO | WO 2004/013375 A1 | 2/2004 |
| WO | WO 2005/015613 A3 | 7/2005 |

* cited by examiner

PROCESS CHAMBER, INLINE COATING INSTALLATION AND METHOD FOR TREATING A SUBSTRATE

CROSS-REFERENCE TO RELATED APPLICATIONS

This application claims priority under 35 U.S.C. §119(a) to EP 07101677.8, filed Feb. 2, 2007, the entire disclosure of which is incorporated herein by reference for all purposes.

BACKGROUND OF THE INVENTION

The invention concerns a process chamber for the treatment of a substrate, in particular for the coating of a substrate by a PECVD (Plasma Enhanced Chemical Vapour Deposition) method, comprising a recipient, treatment tools for generating the reaction conditions for the treatment of the substrate, at least one movable carrier in the recipient, said carrier for carrying at least one substrate, a transport device for transporting the carrier into the recipient or from the recipient along a transport route defined by the movement, wherein the transport device has at least one guidance device for guiding at least one carrier along the transport route. Furthermore, the invention concerns an inline coating installation, in particular an inline PECVD (Plasma Enhanced Chemical Vapour Deposition) coating installation, as well as a method for the treatment of a substrate arranged at a carrier, in particular a method for coating by a PECVD (Plasma Enhanced Chemical Vapour Deposition) method.

Various methods for the coating of substrates are known. One of these methods, which is used for example, for the production of photoelectric cells, is the PECVD (Plasma Enhanced Chemical Vapor Deposition) method. The different layers in the context of PECVD coating are usually applied in cluster installations.

In the case of cluster PECVD installations, especially the transport and the contacting between the substrate carriers and the electrodes or electrode connections provided in the coating chamber have proved problematic and limiting for throughput. A frequent cause of poor contacting is the thermal expansion of the substrate carriers due to high process temperatures.

This led to a relatively complex structure for the reaction chambers, high maintenance costs and a lowering of the throughput due to complex transport and contacting measures. In addition, errors during contacting can lead to inadequate coating results and installation outages.

SUMMARY OF THE INVENTION

Starting from this, the object of the present invention is to propose a coating chamber, a coating installation and a method which each ensure simple transport as well as secure and reliable contacting with the substrate carriers in a reaction chamber.

This object is achieved by the provision of a process chamber in accordance with claim 1, an inline coating installation in accordance with claim 16, and by a method in accordance with claim 18.

The process chamber (reaction chamber) in accordance with the invention for the treatment of a substrate, in particular for the coating of a substrate by a PECVD (Plasma Enhanced Chemical Vapour Deposition) method, comprises a recipient, treatment tools for generating the reaction conditions for the treatment of the substrate, at least one movable carrier in the recipient, said carrier for carrying at least one substrate, a transport device for transporting the carrier into the recipient or from the recipient along a transport route defined by the movement, wherein the transport device has at least one guidance device for guiding at least one carrier along the transport route. Furthermore, the process chamber comprises means inside the process chamber for uncoupling a carrier positioned in a transport position from the guidance device, and means for the acceptance of the carrier from the guidance device, wherein the means for acceptance comprise a transfer device for transferring the carrier from the transport position into a treatment position transverse to the transport direction.

The process chamber finds particular employment in stationary PECVD coating processes. The carriers comprise, for example, a frame to which the substrate is fastened. The transfer device accepts a carrier and removes this transversely, i.e. laterally, from the transport route after uncoupling from the guidance device. Generally, the underlying idea of the invention is to functionally separate both transport and guidance, and transport and contacting, respectively.

In particular, the process chamber is formed such that the substrate arranged at the carrier is transportable essentially vertically along the transport route by means of the transport device.

Preferably, the transfer direction is essentially perpendicular to the transport route or to the transport direction, such that the alignment of the substrate in the treatment position of the carrier is essentially parallel to the alignment of the substrate in the transport position of the carrier.

In particular, the process chamber comprises a contact frame arranged in or at the recipient, the purpose of said frame being the contacting and aligning of the carrier in the treatment position at the contact frame. In the treatment position, the carrier is thus laterally offset from the transport route (transport track, transport direction), whereby it is in contact with the contact frame in the treatment position.

In order to make secure contact with the contact frame possible, the carrier can initially be roughly positioned in front of the contact frame by means of a position determination device. For fine positioning, a centring mandrel with a holding lug can traverse into a corresponding centring borehole provided in the lower section of the carrier. In this way, relatively precise approach of the carrier to the contact frame and secure contact between the electrode arranged at the contact frame and a counter-electrode provided in the carrier are created, such that the treatment process can be accomplished trouble-free.

The treatment tools are in particular coating tools, which comprise at least one electrode. In the treatment position, this electrode is brought into contact with the counter-electrode provided at the carrier.

Further coating tools may be provided in the form of for example, a gas inlet, a gas outlet, a counter-electrode provided at the carrier, a power feed for providing electrical power to the electrode to generate the reaction conditions, to generate a plasma for the treatment of the substrate, etc.

In particular, the electrode is arranged at the contact frame. In this way, it is ensured that the carrier aligned opposite the contact frame is securely positioned such that counter-contacts provided at the carrier also make secure contact with corresponding counter-contacts at the contact frame during thermal expansion of the carrier and the substrate.

Preferably, in the treatment position, the contact frame has contacts for creating a connection to corresponding counter-contacts arranged at the carrier. The carrier can be drawn, for example, via support arms against the contact frame of the electrode in order that contact may be established between the rear electrode of the carrier and the electrode of the contact frame. The carrier may additionally be equipped with springy contacts in the section of the contact frame. The invention thus ensures reliable, reproducible transport as well as contact of the carrier in an inline coating installation, even at elevated operating temperatures and associated thermal expansion of the carrier.

The transport device has in particular at least one drive and means for transmitting the driving force for transporting the carrier along the transport route.

In a preferred embodiment, the means for transmitting the driving force have at least a first roller positioner, which in the transport position has an operative connection with the carrier. The operative connection with the transport device can, for example, be frictional engagement of the rolls of a first lower roller positioner with a lower guide rail of the carrier. Additionally, for example, a second, non-driven upper roller positioner for locating the vertically arranged carrier during transport may be provided. The transmission of the driving force of a drive provided outside of the recipient to the rolls may be effected via a vacuum through-guide into the recipient. The roller positioner can, in order that it may be uncoupled later from the carrier, be detachably connected to the drive by means of a magnetic coupling.

In particular, the guidance device has at least one roller positioner. A lower and/or an upper roller positioner can be formed merely as guiding element or as guiding and drive element. The carrier has corresponding upper and lower guide rails, which engage in the transport position with the roller positioners. Transport of the carrier from one module of a coating installation to another module takes place in the transport position. The roller positioners, in particular the upper guide rolls of the carrier, may be formed such that expansion of the carrier through heating is possible and changes in vertical expansion are accommodated.

Preferably, the means comprise at least one lifting device for uncoupling the carrier from the guidance device. Since, in accordance with the invention, horizontal transfer of the vertically aligned carrier must be accomplished during the transition from the transport or transfer position to the treatment position, active uncoupling must take place from the guidance device during the transition from transport position to the transfer position. This can be effected by means of a lifting device for the roller conveyors. The lower roller conveyor is traversed downward, such that the carrier held previously by means of support arms is out of engagement with the lower roller conveyor. The uncoupling from the upper roller conveyor can be effected by a stroke of the upper roller conveyor upward, or preferably by lowering the carrier prior to acceptance by the acceptance device. Candidate lifting drives are, for example, electric motors with spindle transmission or pneumatic cylinders.

The lifting device is thus formed especially for lowering and/or raising at least a part of the guidance device and/or lowering or raising the carrier and/or uncoupling the carrier from the guidance device or coupling to the guidance device. The stroke occurs, for example, perpendicularly to the transport direction and/or perpendicularly to the transfer direction, thus usually essentially vertically downward for the purpose of lowering the lower guidance device and vertically upward for the purpose of coupling the carrier (for example, before transport of the carrier away from the coating station after coating). During uncoupling, the carrier disengages from the operative connection with the transport device, during coupling, an operative connection is established.

The means of acceptance comprise preferably at least a frame and/or a support arm with an actuation device for moving the frame or the support arm. The frame and/or support arms can, by means of the actuation device (drive), move the carrier at least in the transfer direction between the transfer position and the treatment position.

The means of acceptance have in particular means of engagement for engaging with corresponding devices formed at the carrier. A means of engagement may, for example, be at least one, in particular several pick-up forks, which are connected to the support arm.

For acceptance of the carrier by the means of acceptance, for example, two support arms may be provided, which engage at several points right and left of the vertically aligned sides of the carrier. Thus, pick-up forks can be traversed into lateral recesses of the carrier. Through the lowering of the roller positioner, the carrier is lowered likewise and transferred into the pick-up forks.

The stroke of the lower roller positioner is chosen such that the carrier loses contact with the upper guidance and subsequently (during acceptance by the transfer device) the lower roller positioner releases the lower guide rail of the carrier. The position of the carrier recesses and the positions of the forks are chosen such that the substrate centre and the electrode centre are at the same height when the carrier approaches the contact frame. In this way, it is ensured that the substrate is always similarly positioned relative to the electrode, irrespective of temperature variations.

Actuation of the support arms by means of a support arm actuation causes the carrier to be drawn against the contact frame at which the electrode is arranged in order that a contact may be established between the rear electrode of the carrier and the electrode.

For locating the contact, a centring mandrel arranged at the process chamber may be tightened, such that the carrier is drawn via the holding lug of the centring mandrel additionally to the contact frame. In the upper section of the carrier, a locking bolt with a rotating device can be provided for additional pressing, which in a lowered position traverses into an opening arranged at the carrier and is rotated through 90° during tightening.

After the coating process is concluded, the carrier is detached in reverse order from the contact frame and returned to the transport position. After coupling to the transport device, transport takes place to the next coating module.

It is clear without further ado that the invention is particularly suitable for inline coating installations, in which several coating stations are arranged in series.

In a special embodiment, the actuation device is formed such that, through the actuation and the movement of the carrier coupled to the transfer device, the transport route is freed for the transport of other carriers. For example, the support arms may be formed with a stroke extension. During a static coating process for a substrate, different carriers can thus move past the occupied coating station and "overtake" the carrier which is in the treatment position. Sequential approach by all coating stations is thus avoided. As a result, depending upon the cycle time of the installation, the ratio of deposition time to transport/contacting time is substantially improved in this way and the throughput of the installation is increased.

Through the functional separation of transport and guidance of the carriers from contacting, design scope for low-deformation pressing of the carriers (including the counter-electrode) to the electrode is increased. In addition, functional separation of transport from contacting ensures that the roller positioner and the guide rail are released during the coating of a substrate, such that other carriers can move past the coating module. This is particularly advantageous with an inline PECVD installation.

The object is also achieved by the provision of an inline coating installation, in particular an inline PECVD (Plasma Enhanced Chemical Vapour Deposition) coating installation, comprising at least one process chamber described as above.

In particular, two or more of the process chambers in accordance with the invention may be arranged in series. The transport route between the process chambers determines the transport direction.

A main advantage of the use of inline coating installations for PECVD methods relative to conventional cluster PECVD installations consists in substantially higher productivity of the inline installations. Given the same productivity, the use of inline installations can reduce the space requirement.

Through the facilitation of "overtaking procedures" between the carriers, as provided for in the present invention, flexibility during operating of the inline coating installation can be increased and thus throughput increased.

Additionally, the object is achieved by a method for the treatment of a substrate arranged at a carrier, in particular methods for coating by a PECVD (Plasma Enhanced Chemical Vapor Deposition) method, comprising the steps: a) Transport of a carrier loaded with at least one substrate along a first transport route into the interior of a process chamber, in particular into the interior of a process chamber as described above, into a transport position by means of a transport and guidance device; b) Actuation of a acceptance device; c) Actuation of an uncoupling device for creating engagement for the purpose of the acceptance of the carrier by the acceptance device and for the uncoupling of the carrier from the transport and guidance device; d) Actuation of the acceptance device for creating a, relative to the transport route, lateral movement of the carrier to a contact frame arranged laterally from the transport route, the purpose of said frame being contacting of the carrier with the contact frame and for the creation of a contact between contacts formed at the carrier and correspondingly at the contact frame, and e) Commencement of the treatment process.

In particular, the substrate is essentially aligned vertically during the execution of the method. The substrate is usually a flat, in many cases a large-surface-area, planar, rectangular element. Precisely such substrates lend themselves to vertical transport through an installation for space reasons and for reasons of substrate handling.

In particular, the actuation of the uncoupling device in step c) is effected by the lowering of a roller positioner.

In particular, after reaching the contact position in step d), the carrier is laterally offset such that the transport route is freed such that it may be passed by other carriers along the transport route.

In a special embodiment, the method is repeated in several process chambers arranged in series.

BRIEF DESCRIPTION OF THE DRAWINGS

Further objects and advantages of the invention result from the following description of specific embodiments. These show in FIG. 1: A cross-sectional view of a process chamber in accordance with the present invention.

DESCRIPTION OF SPECIAL EMBODIMENTS

Figure 1:
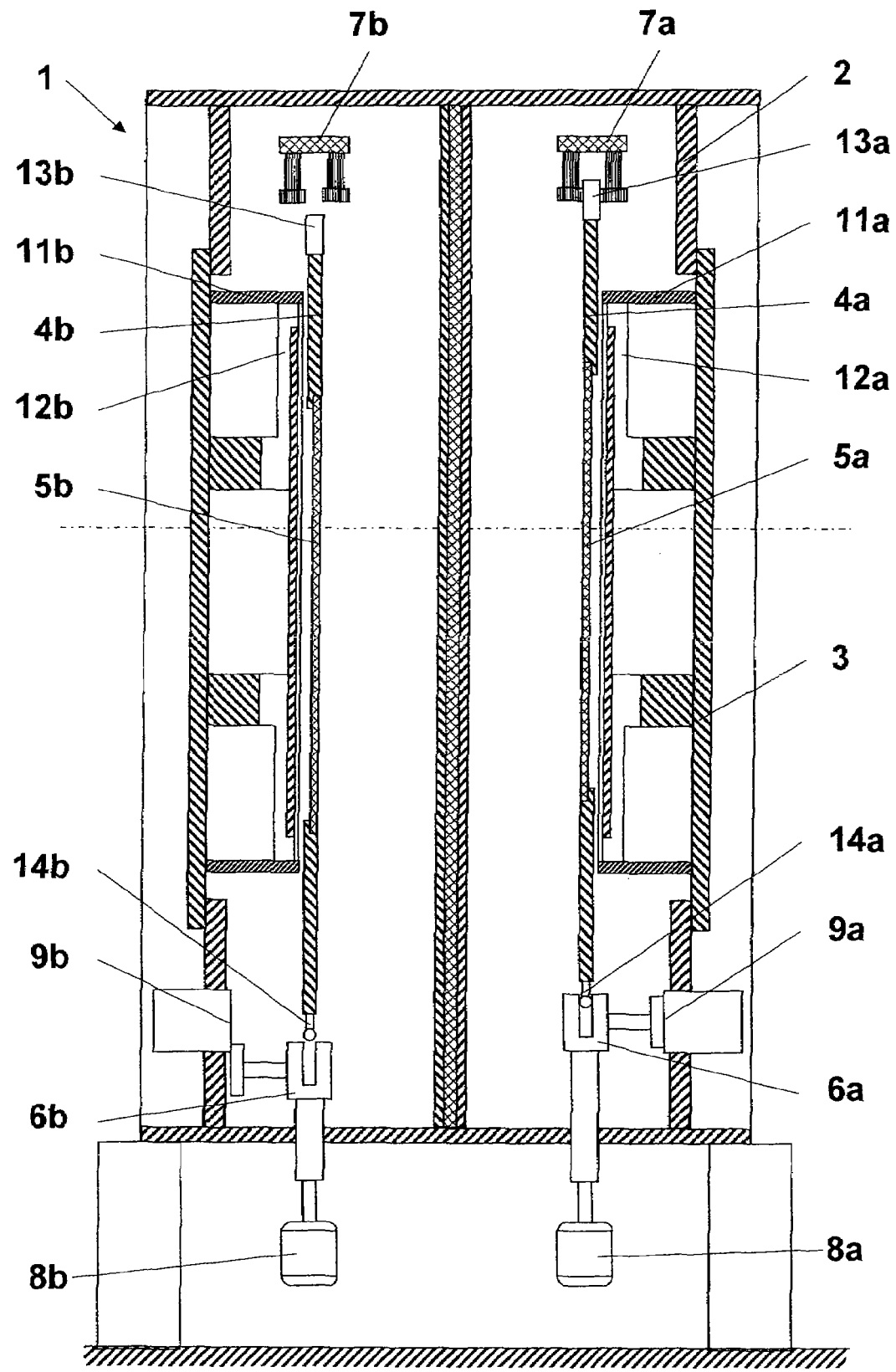

FIG. 1 shows a cross-sectional view through a process or reaction chamber 1 for performing PECVD (Plasma Enhanced Chemical Vapour Deposition) coating.

The reaction chamber 1 comprises a recipient 2 with at least one door 3 for facilitating access into the interior of the recipient 2. The reaction chamber 1 is designed in the present case as a double chamber for the coating of two substrates. However, in the context of the invention, this is expressly not absolutely necessary.

Inside the recipient 2, two carriers 4a and 4b are arranged, wherein the first carrier shown on the right in 4a is in a transport position, whereas the second carrier 4b on the left is in a contact and/or treatment position. The first carrier 4a carries a first substrate 5a, the second carrier 4b carries a second substrate 5b.

The reaction chamber 1 as part of an inline PECVD coating installation for the stationary coating of substrates 5a, 5b has a transport device for transporting the carriers 4a and 4b loaded with the substrates 5a and 5b inside the recipient 2 and for transporting between different recipients 2, modules, chambers, coating stations, etc. The transport device in the present embodiment comprises lower roller positioners 6a and 6b, whose rolls can be driven by a drive (21; see FIG. 3) for transporting a first carrier 4a arranged in the transport position. The first lower roller positioner 6a can on one hand set in motion and transport the first carrier 4a in a direction perpendicular to the plane of the page level, on the other the lower roller positioner 6a serves as lower guideway for the first carrier 4a and defines its transport route. For this purpose, the lower guide rail 14a of the first carrier 4a is in engagement with the roller positioner 6a.

Beyond that, upper guideways 7a and 7b with guide rolls are also provided, wherein the first carrier 4a arranged in the transport position is guided by the first upper guideway 7a. An upper guide rail 13a of the first carrier 4a is in engagement with the guide rolls of the first upper guideway 7a. The upper guideway 7a is formed such that a change in the linear expansion of a carrier 4a and 4b (for example, along its vertical expansion) caused by changes of temperature can be accommodated.

For coupling and uncoupling of a carrier 4a or 4b to or from the guideway and the transport device 6a, 7a, the roller positioners 6a and 6b each have a lifting device 8a, 8b. In the transport position of the first carrier 4a shown on the right, the lifting device 8a is extended, such that the first roller positioner 6a in an upper position is in engagement with the lower guide rail 14a of the first carrier 4a. Via a magnetic coupling 9a or 9b, the first lower roller positioner 6a or the second lower roller positioner is magnetically coupled to a capstan. The drive (not shown) is arranged in the present embodiment outside of the recipient 2 and transfers the force to the rolls of the first lower roller positioner 6a via a vacuum through-feed 10 and the coupled magnetic clutch 9a.

In the recipient 2, furthermore, contact frames 11a and 11b are firmly arranged, i.e. not movably inside the process chamber, for example, attached to the recipient. The contact frames 11a and 11b are driven close to the carriers 4a and 4b and afterwards brought into contact with them. The contact frames 11a and 11b each have at least one electrode 12a and 12b. The first electrode 12a of the first contact frame 11a is not in contact with the first carrier 4a, since the first carrier 4a is in the transport position. The second carrier 4b, in contrast, is in a contact or treatment position and rests against the second contact frame 11b, i.e. is pressed against this, and contacts the second electrode 12b with a corresponding counter-electrode provided in the carrier 4b.

Transfer between the transport position, the position uncoupled from the transport device (uncoupling position), and the contact or treatment position of the carriers 4a, 4b and thus of the substrates 5a, 5b is effected by a specially formed transfer/acceptance device (not shown in FIG. 1). The means for the acceptance of the carrier from the transport device are described in more detail on the basis of FIGS. 2 and 3. They transfer the carrier 4a from the transport position shown on the right in FIG. 1 into a contact position shown on the left in FIG. 1.

Figure 2:
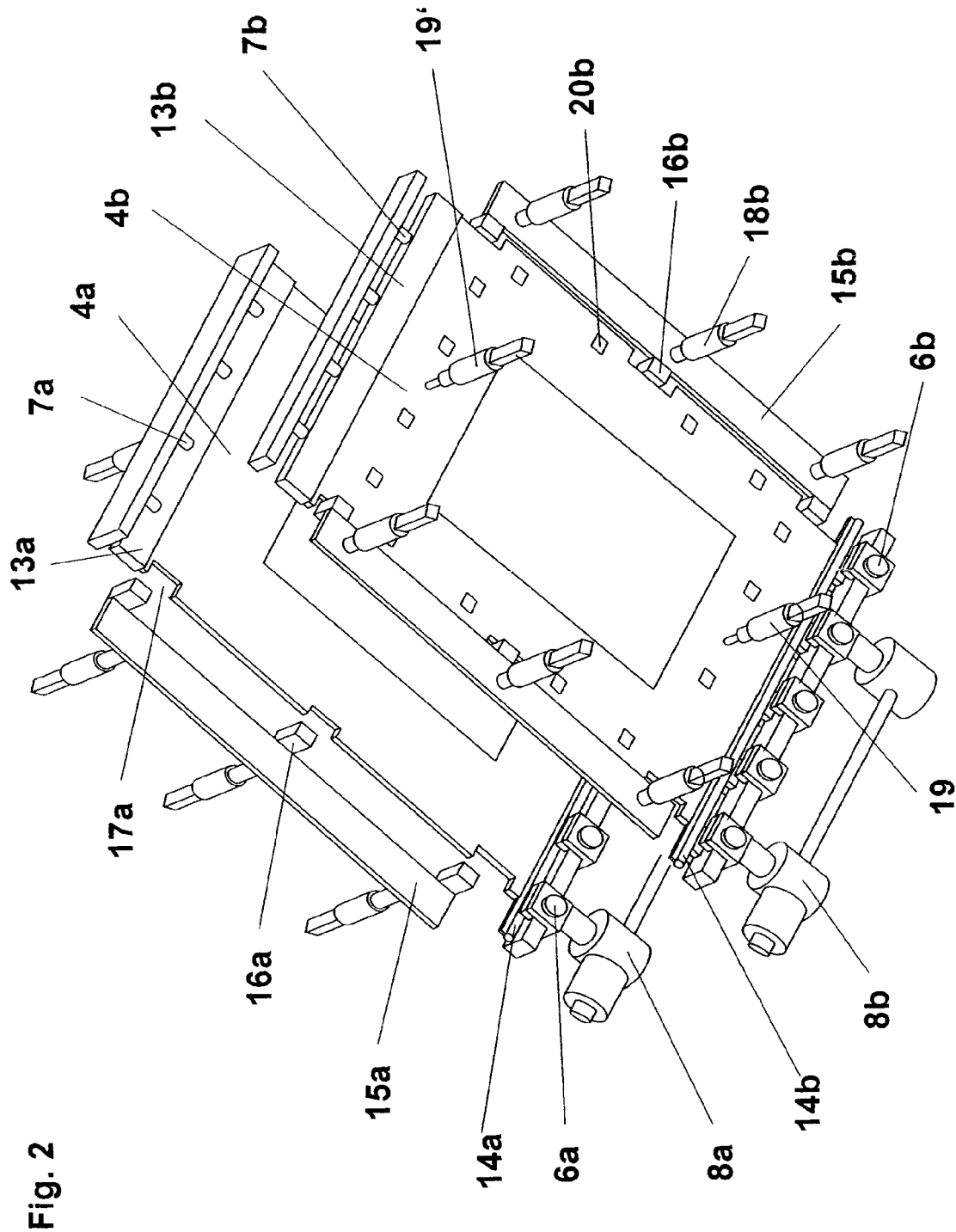
FIG. 2: A three-dimensional view of essential components of the process chamber of the invention.

FIG. 2 shows a three-dimensional view of the essential parts of a reaction chamber in accordance with the invention, in particular also transfer/acceptance devices 15a, 16a and 15b, 16b.

As in FIG. 1, two carriers 4a and 4b are shown, wherein the first carrier 4a is in a transport position, the second carrier 4b in a transfer position (uncoupling position).

In the transport position, the lifting device 8a for the lower roller positioner 6a is extended, such that the first carrier 4a with its upper guide rail 13a and its lower guide rail 14a is in engagement with corresponding upper and lower guide rolls or capstans 7a and 6a of the transport and guidance device of the installation. Transport along a transport route between the modules of the treatment installation takes place by means of the driving of rolls of the lower roller positioner 6a and transmission of power to the carrier 4a by friction.

The transfer/acceptance device 15a, 16a for the first carrier 4a is out of engagement with the first carrier 4a in the transport position. The transfer/acceptance device 15a, 16a has first support arms 15a, at which pick-up forks 16a are arranged. These pick-up forks 16a can engage with correspondingly formed carrier recesses 17a and thus accept the carrier 4a and move it from a transport position into a further position, e.g. a contact or a coating position in contact with a contact frame (not shown), as soon as the first carrier 4a is roughly positioned.

The components shown using the second carrier 4b correspond to the components already described using the first carrier 4a.

However, the second carrier 4b shown in FIG. 2 is in an uncoupling position. The second carrier 4b has been accepted by the second transfer/acceptance device 15b, 16b with support arms 15b and pick-up forks 16b, i.e. the second pick-up forks 16b engage with corresponding carrier recesses 17b at the second carrier 4b and carry the carrier 4b.

In the uncoupling position, the second carrier 4b is uncoupled or separated from the guideway and the transport device. The upper guide rail 13b and the lower guide rail 14b of the second carrier 4b are not in engagement or contact with the upper or lower roller positioners 7b and 6b.

For changing from the transport position to the uncoupling position, the second carrier 4b is transported first to a position assigned to a second contact frame (not shown) on the transport route and centred roughly in relation to a contact frame (not shown). For precision centring, the reaction chamber has a lower precision centring device 19 and an upper precision centring device 19', for example, in the form of a centring mandrel with holding lug, which engages with a corresponding centring borehole of the carrier 4b.

Subsequently, the second support arms 15b are moved by support arm actuations 17b toward the second carrier 4b, such that the second pick-up forks 16b of the second transfer/acceptance device 15b, 16b are pushed into carrier recesses 17b of the second carrier. The support arm actuations 17b can be suitable for facilitating both vertical and horizontal movements of the support arms 15b.

Subsequently, the magnetic clutch 9b shown in FIG. 1 is uncoupled. The second lifting device 8b, for example, an electric motor with spindle transmission or a lifting drive by means of pneumatic cylinders, will then traverse into a lowered position. As a result, the second carrier 4b lowers itself also. The lowering brings the upper guide rail 13b out of engagement with the upper roller positioner 7b. While, after a defined lowering, the second carrier 4b comes into engagement with the pick-up forks 16b retracted into the recesses 17b, until it is carried by these, the second lifting device 8b lowers itself further, such that the lower roller positioner 6b also releases itself from engagement with the lower guide rail 14b of the second carrier 4b. The carrier 4b has been accepted by the pick-up forks 16b of the support arms 15b. The stroke is chosen such that the carrier 4b is no longer in the upper and lower guideway 7b and 6b. The second carrier 4b now assumes the uncoupling position shown.

From the position shown using the second carrier 4b, the second carrier 4b can be transferred or moved into further positions, in particular into the desired (stationary) coating position in contact with (not shown) electrodes (12b, see FIG. 1), in which the coating process is performed, or into a contact position with (not shown) a contact frame (11b, see FIG. 1). The transfer is effected by a movement of the support arms 15b by means of actuation by support arm actuations 18b.

After the coating process has been concluded, the carrier 4b is brought in reverse sequence back into the transport position and transported to the next process module.

Figure 3:
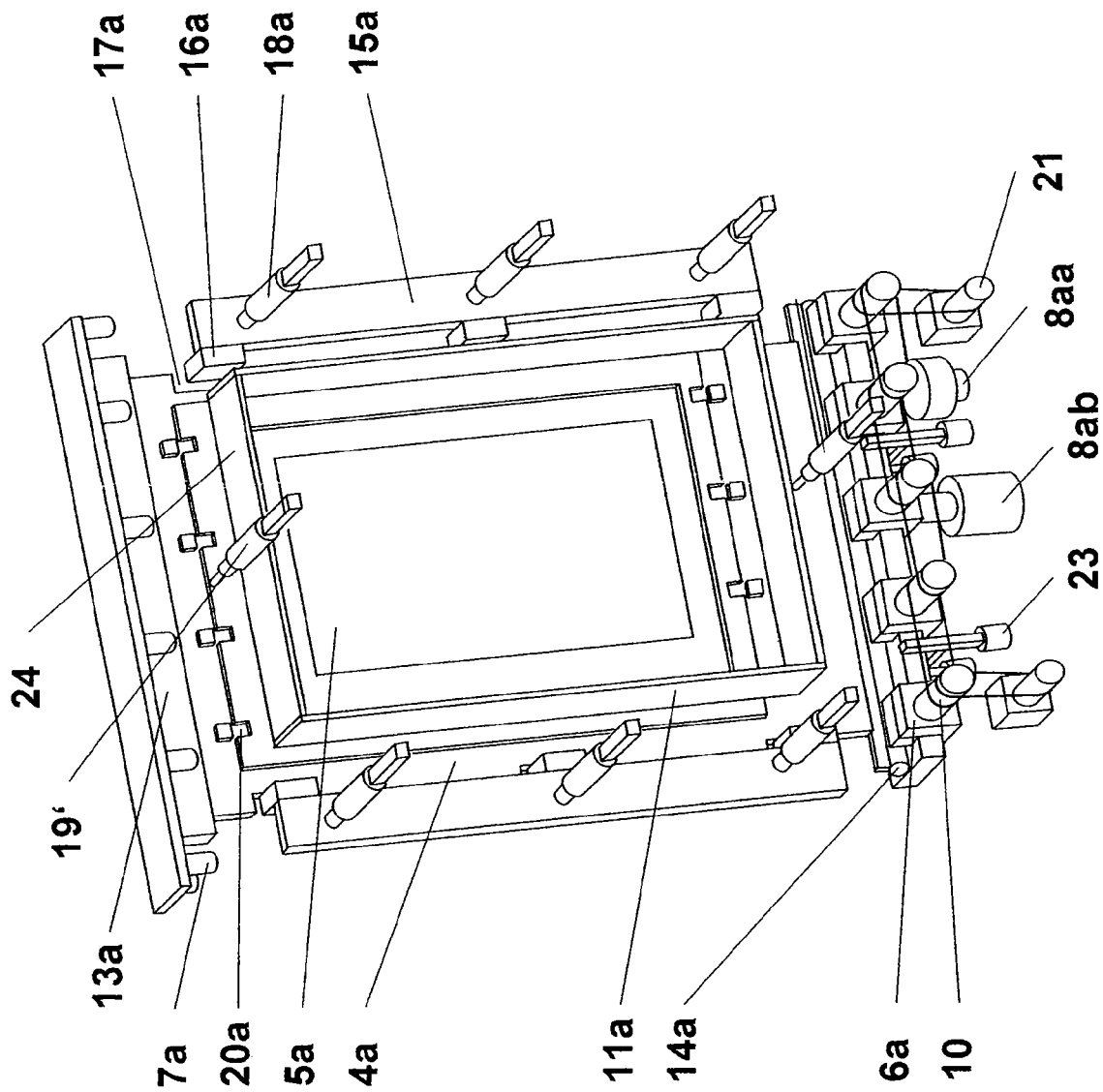
FIG. 3: A further three-dimensional view of essential components of the process chamber of the invention.

FIG. 3 shows a three-dimensional view of further essential components of the reaction chamber in accordance with the invention.

The carrier 4a is in a transport position, in which the upper guide rail 13a is in engagement with upper guide rolls 7a. The lower guide rail 14a is accordingly in engagement with lower guide rolls 6a. The lower guide rolls 6a are couplingly or uncouplingly connected to a drive 21 for the lower roller positioner 6a via vacuum through-feeds 10 with corresponding magnetic clutches.

The carrier 4a is roughly positioned in front of a contact frame 11a. For the rough positioning, a position determination system 23 is provided. After rough positioning has been accomplished, the support arms 15a will traverse by actuation of the support arm drives 18a, as described in connection with FIG. 2. The pick-up forks 16a of the support arms 15a engage with corresponding receivers 17a in the carrier 4a.

In order that the carrier 4a may be brought out of contact with the transport device 6a, 7a, the roller positioner 6a is uncoupled first from drive 21 and, by means of a lifting device 8a, for which the lifting guide 8aa and the lifting drive 8ab for the roller positioner 6a are shown, is traversed downward. The pick-up forks 16a accept the carrier 4a during lowering of the roller positioner 6a.

After the acceptance of the carrier 4a by the support arms 15a, the carrier 4a is moved by actuation of the support arms 15a toward the contact frame 11a and brought into contact with this (contact position). The carrier 4a is drawn by the support arms 15a against the contact frame 11a with the electrode (12a, see FIG. 1) arranged at the contact frame 11a in order that contact may be created between the contacts 20a (connected to the rear electrode of the carrier 4a) and the electrode (12a, see FIG. 1). In this regard, contacts 20a provided in the carrier 4a are brought into contact with corresponding counter-contacts 24 arranged at a contact frame 11a (see also FIG. 1), such that energy input from contact frame 11a to the carrier 4a is facilitated.

In order that reliable contact may be ensured, the contacts 20a of the carrier 4a can also be designed as springy contacts. Furthermore, the lower centring mandrel 19 can have a rotating device, which effects an additional forward movement of the carrier 4b to the contact frame 11a. The locking bolt 19 is tightened (e.g. turned through 90°), such that the carrier 4a is pressed via the corresponding holding lugs additionally against the contact frame 11a.

In a special embodiment and given corresponding shape of the support arms 15a, 15b and/or corresponding arrangement of the contact frame 11a, 11b relative to the transport route, it is possible for other carriers 4a, 4b to pass by a carrier 4a, 4b arranged in the coating position and to overtake the carrier 4a, 4b. As a result, strictly sequential approach of all coating modules is circumvented by all carriers in an inline installation. Greater flexibility is possible and thus the cycle time of the installation can be increased. Overall, the use of the reaction chamber in accordance with the invention, e.g. an inline coating installation, increases throughput in the way that, depending upon the cycle time of the installation, the ratio of deposition time to transport/contacting time is substantially improved.

The invention claimed is:

1. Process chamber for treatment of a substrate by (Plasma Enhanced Chemical Vapor Deposition), comprising
   a recipient,
   treatment tools for generating reaction conditions for treatment of the substrate,
   at least one movable carrier in the recipient, said carrier for carrying at least one substrate, and
   a transport device for transporting the carrier into the recipient or from the recipient along a transport route,
   wherein the transport device has at least one guidance device for guiding at least one carrier along the transport route;
   wherein in a transport position the carrier is not in contact with a contact frame,
   wherein the contact frame comprises a first electrode and the carrier comprises a second electrode, and in a treatment position the carrier is laterally offset from the transport position and the first electrode is in contact with the second electrode;
   wherein the process chamber comprises:
      at least one lifting device inside the recipient for uncoupling a carrier positioned in the a transport position from the guidance device ; and
      at least one support for the acceptance of the carrier from the guidance device, wherein the at least one support transfers the carrier along a transfer direction from the transport position into the treatment position transverse to the transport direction toward the contact frame and in contact with the contact frame by actuation of the support.

2. Process chamber in accordance with claim 1, wherein the process chamber is formed such that the substrate arranged at the carrier is transportable substantially vertically aligned along the transport route by the transport device.

3. Process chamber in accordance with claim 1, wherein the transfer direction is aligned substantially perpendicular to the transport route, such that alignment of the substrate in the treatment position of the carrier is substantially parallel to alignment of the substrate in the transport position of the carrier.

4. Process chamber in accordance with claim 1, wherein the contact frame includes one or more contact frames disposed inside the recipient for the purpose of alignment of the carrier in the treatment position at the contact frame and for contacting the contact frame through the carrier.

5. Process chamber in accordance with claim 4, wherein in the treatment position, the contact frame has contacts for creating an electrical connection to corresponding countercontacts arranged on the carrier.

6. Process chamber in accordance with claim 1, further comprising at least one treatment electrode.

7. Process chamber in accordance with claim 6, wherein the at least one treatment electrode is arranged on the contact frame.

8. Process chamber in accordance with claim 1, wherein the transport device has at least one drive and and said guidance device transmits the driving force from the drive in order to transport the carrier along the transport route.

9. Process chamber in accordance with claim 8, wherein the means for transmitting the driving force have at least a first roller position.

10. Process chamber in accordance with claim 1, wherein the guidance device has at least one roller position.

11. Inline coating installation, comprising at least one of the process chambers of claim 1.

12. Inline coating installation, comprising two or more of the process chambers of claim 1 arranged in series.

13. A processing apparatus to treat substrates, the apparatus comprising:
   at least one processing chamber;
   a movable carrier to hold and carry one of the substrates;
   a transport device to transport the movable carrier through the processing chamber along a transportation route, wherein the transport device includes a guidance device to guide the movable carrier along the transportation route;
   a lifting device to couple and uncouple the guidance device from the movable carrier; and
   a transfer device to transfer the moveable carrier uncoupled from the guidance device to a processing position, wherein the transfer device moves the uncoupled movable carrier in a direction transverse to the transportation route
   wherein in a transport position the moveable carrier is not in contact with a contact frame,
   wherein the contact frame comprises a first electrode and the carrier comprises a second electrode, and in a treatment position the moveable carrier is laterally offset from the transport position and the first electrode is in contact with the second electrode.

14. The processing apparatus of claim 13, wherein the apparatus further comprises treatment tools for treating the substrate when the movable carrier is in the processing position.

15. The processing apparatus of claim 14, wherein the treatment tools comprise PECVD tools to deposit a coating on the substrate.

16. The processing apparatus of claim 13, wherein the lifting device is operable to raise and lower at least part of the guidance device.

17. The processing apparatus of claim 13, wherein the transfer device comprises a frame and support arm operable to be coupled and uncoupled from the movable carrier, wherein the transfer device also comprises an actuation device to move the frame and support arm.

18. The processing apparatus of claim 13, wherein the transport device is operable to transport a second movable carrier along the transportation route when a first movable carrier is uncoupled from the guidance device and in the processing position.

19. The processing apparatus of claim 13, wherein the apparatus comprises two adjacent processing chambers positioned to face each other.

* * * * *